United States Patent
Wu et al.

(10) Patent No.: US 9,897,303 B2
(45) Date of Patent: Feb. 20, 2018

(54) WAVELENGTH CONVERSION DEVICE, LIGHT SOURCE SYSTEM AND PROJECTION SYSTEM

(71) Applicant: APPOTRONICS CORPORATION LIMITED, Shenzhen (CN)

(72) Inventors: Xiliang Wu, Shenzhen (CN); Zifeng Tian, Shenzhen (CN); Dayan Dai, Shenzhen (CN); Yusan Chen, Shenzhen (CN); Yanzheng Xu, Shenzhen (CN)

(73) Assignee: APPOTRONICS CORPORATION LIMITED, Shenzhen (CN)

( * ) Notice: Subject to any disclaimer, the term of this patent is extended or adjusted under 35 U.S.C. 154(b) by 0 days.

(21) Appl. No.: 15/310,396

(22) PCT Filed: May 6, 2015

(86) PCT No.: PCT/CN2015/078353
§ 371 (c)(1),
(2) Date: Nov. 10, 2016

(87) PCT Pub. No.: WO2015/172670
PCT Pub. Date: Nov. 19, 2015

(65) Prior Publication Data
US 2017/0167710 A1 Jun. 15, 2017

(30) Foreign Application Priority Data
May 13, 2014 (CN) .......................... 2014 1 0201900

(51) Int. Cl.
*F21V 29/502* (2015.01)
*G03B 21/20* (2006.01)
(Continued)

(52) U.S. Cl.
CPC ............... *F21V 29/502* (2015.01); *F21V 9/08* (2013.01); *F21V 9/16* (2013.01); *F21V 29/86* (2015.01); *G03B 21/16* (2013.01); *G03B 21/204* (2013.01)

(58) Field of Classification Search
CPC .......... F21V 29/502; F21V 29/86; F21V 9/16; F21V 9/08; G03B 21/16; G03B 21/204;
(Continued)

(56) References Cited

U.S. PATENT DOCUMENTS 7,196,354 B1 * 3/2007 Erchak ................. H01L 33/507
257/79
2014/0003074 A1 1/2014 Kishimoto
(Continued)

FOREIGN PATENT DOCUMENTS

CN 1759346 A 4/2006
CN 101346818 A 1/2009
(Continued)

OTHER PUBLICATIONS

The World Intellectual Property Organization (WIPO) International Search Report for PCT/CN2015/078353 dated Aug. 13, 2015 pp. 1-8.

*Primary Examiner* — Joseph L Williams
*Assistant Examiner* — Jose M Diaz
(74) *Attorney, Agent, or Firm* — Anova Law Group, PLLC (57) ABSTRACT

The present disclosure provides a wavelength conversion device, and its light source system and projection system. The wavelength conversion device includes a wavelength conversion material layer, and a first light-filtering layer on a first side of the wavelength conversion material layer. The wavelength conversion device also includes a first thermally-conductive dielectric layer configured between the
(Continued)

wavelength conversion material layer and the first light-filtering layer. The first thermally-conductive dielectric layer has a thermal conductivity greater than or equal to the wavelength conversion material layer, and has a refractivity less than the wavelength conversion material layer. Accordingly, the heat generated by the wavelength conversion material layer may be timely conducted out, thus improving the conversion efficiency of the wavelength conversion device.

18 Claims, 2 Drawing Sheets

(51) Int. Cl.
| | |
|---|---|
| *F21V 9/16* | (2006.01) |
| *F21V 9/08* | (2018.01) |
| *F21V 29/85* | (2015.01) |
| *G03B 21/16* | (2006.01) |

(58) Field of Classification Search
CPC ......... G02F 2001/133614; H01L 33/50; F21K 9/50; F21K 9/56
See application file for complete search history.

(56) References Cited

U.S. PATENT DOCUMENTS

| | | | |
|---|---|---|---|
| 2015/0184812 A1* | 7/2015 | Van Bommel | F21V 9/02 362/84 |
| 2016/0043370 A1* | 2/2016 | Hatta | H01M 2/145 307/10.1 |

FOREIGN PATENT DOCUMENTS

| | | |
|---|---|---|
| CN | 101539270 A | 9/2009 |
| CN | 102246527 A | 11/2011 |
| CN | 203489181 U | 3/2014 |
| JP | 2001249370 A | 9/2001 |

* cited by examiner

WAVELENGTH CONVERSION DEVICE, LIGHT SOURCE SYSTEM AND PROJECTION SYSTEM

CROSS-REFERENCE TO RELATED APPLICATION

This application claims priority to PCT Application No. PCT/CN2015/078353, filed on May 6, 2015, which claims priority to Chinese Patent Application CN 201410201900.2, filed on May 13, 2014, all of which is hereby incorporated by reference in its their entirety.

FIELD OF THE INVENTION

The present invention generally relates to the field of light source system and, more particularly, relates to a wavelength conversion device, a light source system, and a projection system.

BACKGROUND

With continuous improvement in the level of industrial development, application fields of light sources become increasingly diversified. For example, the light sources may be applied in image projection of rear-projection televisions or projectors, or used as illumination lamps for vehicles, vessels, or aircraft. Different application fields have different requirements on the color (or wavelength) of a light source. Currently, an excitation light source (having excitation light with a pre-determined wavelength) is used to illuminate a wavelength conversion device to excite the wavelength conversion material in the wavelength conversion device, thus obtaining light with a designated color (or wavelength). Common excitation light sources include traditional high pressure mercury light sources, and emerging semiconductor light sources (LED light sources) and solid-state laser sources. Among them, the brightness of the semiconductor light sources is insufficient, making it difficult for the semiconductor light sources to replace the traditional high pressure mercury light sources. Due to high brightness and high stability, the solid-state laser sources are gradually developed to be one of the main techniques among all excitation light sources.

Figure 1:
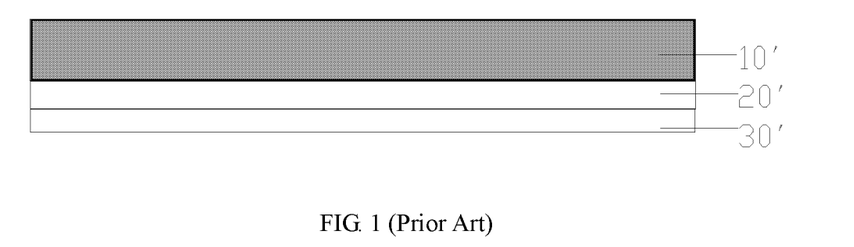
FIG. 1 illustrates a schematic view of an existing wavelength conversion device.

FIG. 1 illustrates a schematic view of a structure of an existing wavelength conversion device. As shown in FIG. 1, the existing wavelength conversion device includes a wavelength conversion material layer 10', a light-filtering layer 30', and a dielectric layer 20'. In particular, the wavelength conversion material layer 10' is configured on one side of an excitation light source, the light-filtering layer 30' is disposed on one side of the wavelength conversion material layer 10' facing towards the excitation light source, and the dielectric layer 20' is sandwiched between the wavelength conversion material layer 10' and the light-filtering layer 30'.

An operation process of the above-described wavelength conversion device is as follows. Excitation light emitted by the excitation light source traverses the light-filtering layer to illuminate the wavelength conversion material layer and excite the wavelength conversion material layer to generate excited light; a part of the excited light traverses the wavelength conversion material layer and emitted there-out, and the rest of the excited light as well as the excitation light unabsorbed by the wavelength conversion material are scattered to the light-filtering layer by the diffuse reflection effect and are further reflected back to the wavelength conversion material layer via the light-filtering layer. Accordingly, the rest of the excited light and the excitation light unabsorbed by the wavelength conversion material can be secondarily utilized, thus improving the utilization rate of the excitation light and the excited light. Particularly, the dielectric layer has a relatively low refractivity and can utilize all reflection to reflect large-angle light (including unabsorbed excitation light unabsorbed) from the wavelength conversion material layer back to the wavelength conversion material layer. Accordingly, excitation light unabsorbed by the wavelength conversion material layer can be secondarily utilized, thus further improving the conversion efficiency of the wavelength conversion device.

In the above-described wavelength conversion device, secondary utilization of the excitation light by the wavelength conversion material layer may increase the heat generated by the wavelength conversion material layer. However, thermal conductivity of the dielectric layer and the light-filtering layer are very poor, thus the heat of the wavelength conversion material layer is hard to be conducted out in time, and therefore the brightness of the excited light generated by the wavelength conversion device and the stability of the wavelength conversion material layer are reduced correspondingly. As the power of the excitation light increases, the heat generated by the wavelength conversion material layer increases, making it more difficult for the heat generated by the wavelength conversion material layer to be timely conducted out, thus rendering the reduction in conversion efficiency of the wavelength conversion device. Towards the above-described issues, there are no effective solutions so far.

BRIEF SUMMARY OF THE DISCLOSURE

The present disclosure aims at providing a wavelength conversion device, a light source system and a projection system to solve the issues in existing techniques that the heat generated by the wavelength conversion material layer is hardly to be conducted out.

To realize the above-mentioned goal, the present disclosure provides a wavelength conversion device including a wavelength conversion material layer and a first light-filtering layer disposed on a first side of the wavelength conversion material layer. The wavelength conversion device also includes a first thermally-conductive dielectric layer configured between the wavelength conversion material layer and the first light-filtering layer. The thermal conductivity of the first thermally-conductive dielectric layer is greater than or equal to the thermal conductivity of the wavelength conversion material layer, and the refractivity of the first thermally-conductive dielectric layer is less than the refractivity of the wavelength conversion material layer.

Further, in the above-described wavelength conversion device, the first thermally-conductive dielectric layer is a porous structure layer containing thermally-conductive particles.

Further, in the above-described wavelength conversion device, the first thermally-conductive dielectric layer covers the surface of the first light-filtering layer, and the contact area between the thermally-conductive particles and the first light-filtering layer accounts for 10%-50% of the total area of the first light-filtering layer.

Further, in the above-described wavelength conversion device, the thickness of the first thermally-conductive dielectric layer is less than 40 μm, and more preferentially less than 20 μm.

Further, in the above-described wavelength conversion device, the first thermally-conductive dielectric layer is made of thermally-conductive dielectric composites containing thermally-conductive particles and glass powders.

Further, in the above-described wavelength conversion device, the first thermally-conductive dielectric layer is made of thermally-conductive particles treated by a silane coupling agent.

Further, in the above-described wavelength conversion device, the volume fraction of the silane coupling agent on surface of the thermally-conductive particles in the first thermally-conductive dielectric layer is 0.1%-1%, and the silane coupling agent is preferentially KH550, KH560, or KH570.

Further, in the above-described wavelength conversion device, the wavelength conversion material layer is a silica gel-phosphor powder layer made of phosphor powders and silica gel.

Further, in the above-described wavelength conversion device, the wavelength conversion material layer is a luminescent glass made of phosphor powders and glass powders.

Further, in the above-described wavelength conversion device, the thermal conductivity of the thermally-conductive particles is greater than 10 W/mK.

Further, in the above-described wavelength conversion device, the thermally-conductive particles are one or more materials selected from diamond, carbon nanotubes, graphene, aluminum nitride, silicon nitride, silicon carbide, boron nitride, aluminum oxide, zinc oxide, and barium sulfate.

Further, in the above-described wavelength conversion device, the thermally-conductive particles are flake-like or fiber-like, and the thermally-conductive particles are white or transparent.

Further, in the above-described wavelength conversion device, the particle size of the thermally-conductive particles is 0.1 μm-20 μm.

Further, in the above-described wavelength conversion device, the wavelength conversion device also includes a second light-filtering layer disposed on a second side of the wavelength conversion material layer.

Further, in the above-described wavelength conversion device, the wavelength conversion device also includes a dielectric layer sandwiched between the wavelength conversion material layer and the second light-filtering layer, and the refractivity of the dielectric layer is less than the refractivity of the wavelength conversion material layer.

Further, in the above-described wavelength conversion device, the wavelength conversion device also includes a second thermally-conductive dielectric layer sandwiched between the wavelength conversion material layer and the second thermally-conductive dielectric layer, the thermal conductivity of the second thermally-conductive dielectric layer is greater than or equal to the thermal conductivity of the wavelength conversion material layer, and the refractivity of the second thermally-conductive dielectric layer is less than the refractivity of the wavelength conversion material layer.

Further, in the above-described wavelength conversion device, the second thermally-conductive dielectric layer has the same feature as the first thermally-conductive dielectric layer described above in the present disclosure.

The present disclosure also provides a light source system including an excitation light source and a wavelength conversion device. In particular, the wavelength conversion device is a wavelength conversion device described above in the present disclosure.

The present disclosure also provides a projection system including a projection unit and a light source system. In particular, the light source system is a light source system described above in the present disclosure.

When applying the technical solutions according to the present disclosure, a first thermally-conductive dielectric layer is configured between the wavelength conversion material layer and the first light-filtering layer. The refractivity of the first thermally-conductive dielectric layer is less than the refractivity of the wavelength conversion material layer, and the thermal conductivity of the first thermally-conductive dielectric layer is greater than or equal to the thermal conductivity of the wavelength conversion material layer. Thus, under the condition where large-angle emitted light is ensured to be all reflected back to the wavelength conversion material layer to improve the light utilization rate, superior thermal conductive performance of the first thermally-conductive dielectric layer can be utilized to timely conduct out the heat generated by the wavelength conversion material layer. Accordingly, the conversion efficiency of the wavelength conversion device is improved.

BRIEF DESCRIPTION OF THE DRAWINGS

The accompanying drawings as a part of the present disclosure are included to provide a further understanding of the present disclosure. Exemplary embodiments of the present disclosure and description thereof are adopted to illustrate the present disclosure, and not intended to form improper limits to the present disclosure. In the drawings.

DETAILED DESCRIPTION

It should be noted that, under non-conflicting conditions, embodiments of the present disclosure and characteristics of the embodiments can combine with each other. Hereinafter, embodiments described with reference to the accompanying drawings are used to illustrate the present disclosure in detail.

It should be noted that, the terminology used herein is for describing particular embodiments only and is not intended to be limiting of exemplary embodiments in the present disclosure. As used herein, unless clearly indicated in the context otherwise, the singular forms "a", "an" and "the" are intended to include the plural forms as well. Further, it should be understood that the terms "comprises", "comprising", "includes" and/or "including", when used herein, specify the presence of features, steps, operations, devices, components, and/or combinations thereof.

For ease of description, spatially relative terms, such as "on", "above", "on surface of", "upper" may be used to describe the spatial relationship between one device or features and other devices or features illustrated in the figures. It should be understood that, spatially relative terms are intended to encompass different orientations of the device in use or operation in addition to the orientation depicted in the figures. For example, if the device in the figures is turned over, the device described as "above other devices or configurations" or "on other devices or configurations" will later, be defined as "below other devices or configurations", or "beneath other devices or configurations". Accordingly, the exemplary term "above" may include both an orientation of "above" or "below". The device may be otherwise oriented (rotated by 90 degrees or at other orientations), and the spatially relative descriptors used herein may be interpreted accordingly.

Figure 2A:
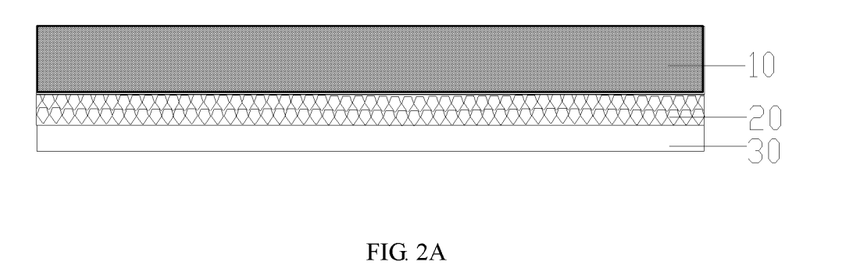
FIG. 2A illustrates a schematic view of an exemplary wavelength conversion device according to a preferred embodiment of the present disclosure.

As introduced in the technical background section, heat generated by the wavelength conversion material layer can hardly be conducted out, thus the brightness and stability of the excited light generated by the wavelength conversion device reduce. Inventors of the present disclosure carried out studies towards the above-mentioned issues, and provided a wavelength conversion device. As shown in FIG. 2A, the wavelength conversion device may include a wavelength conversion material layer 10 and a first light-filtering layer 30 disposed on a first side of the wavelength conversion material layer 10. The wavelength conversion device may also include a first thermally-conductive dielectric layer 20 sandwiched between the wavelength conversion material layer 10 and the first light-filtering layer 30. The thermal conductivity of the first thermally-conductive dielectric layer 20 may be greater than or equal to the thermal conductivity of the wavelength conversion material layer 10. The refractivity of the first thermally-conductive dielectric layer 20 may be less than the refractivity of the wavelength conversion material layer 10. Here, the first side may refer to the light incident side of the wavelength conversion material layer.

In the above-described wavelength conversion device, heat generated by the wavelength conversion material layer 10 may be conducted towards the first side of the wavelength conversion material layer 10 via the first thermally-conductive dielectric layer 20. Accordingly, the heat generated by the wavelength conversion material layer 10 may be timely conducted out, and brightness and stability of the excited light produced by the wavelength conversion device may be further improved. In the meantime, the refractivity of the first thermally-conductive dielectric layer 20 may be less than the refractivity of the wavelength conversion material layer 10, such that large-angle light (including excitation light) from the wavelength conversion material layer 10 may be reflected back to the wavelength conversion material layer 10. Accordingly, excitation light unabsorbed by the wavelength conversion material layer 10 may be secondarily utilized, thus improving the conversion efficiency of the excitation light generated by the wavelength conversion device.

As long as the thermal conductivity of the first thermally-conductive dielectric layer 20 is greater than or equal to the thermal conductivity of the wavelength conversion material layer 10 and the refractivity of the first thermally-conductive dielectric layer 20 is less than the refractivity of the wavelength conversion material layer 10, the heat generated by the wavelength conversion material layer 10 may be timely conducted out. Accordingly, the brightness of the excited light generated by the wavelength conversion device and the thermal stability of the wavelength conversion material layer 10 may be improved. In one preferred embodiment, the first thermally-conductive dielectric layer 20 may be a porous structural layer containing thermally-conductive particles. In particular, the thermally-conductive particles may be stacked and connected with one another to form a reticular structure, and porous structures may form between the thermally-conductive particles. The reticular structure in the first thermally-conductive dielectric layer 20 may timely conduct out the heat generated by the wavelength conversion material layer 10, thus avoiding deterioration of the wavelength conversion material caused by high temperature. Accordingly, the brightness of the excited light generated by the wavelength conversion device and the thermal stability of the wavelength conversion material layer 10 may be improved. Meanwhile, the porous structures may ensure that the excitation light and the excited light can traverse the first thermally-conductive dielectric layer 20 to illuminate the wavelength conversion material layer 10. Further, the excitation light and the excited light may be scattered to the first light-filtering layer 30 by the diffuse reflection effect of the wavelength conversion material layer 10, and further be reflected back to the wavelength conversion material layer 10 by the first light-filtering layer 30. Accordingly, the excited light may be secondarily utilized, thus improving the conversion efficiency of the excitation light. The pores in the first thermally-conductive dielectric layer 20 may be filled with air, thus improving the reflection effect of the interface between the first thermally-conductive dielectric layer 20 and the wavelength conversion material layer 10 on the large-angle light from the wavelength conversion material layer 10.

The heat generated by the wavelength conversion material layer 10 may be conducted mainly through the contact area between the thermally-conductive particles in the first thermally-conductive dielectric layer 20 and the first light-filtering layer 30. The larger the contact area, the better the thermal conductive (heat dissipation) effect of the first thermally-conductive dielectric layer 20, and the poorer the reflection effects of the first light-filtering layer towards the excited light, which is not beneficial for light to traverse the first thermally-conductive dielectric layer 20. For the wavelength conversion device to have optimal thermal conductive (heat dissipation) effect and optimal reflection effects by the excited light, in one preferred embodiment, the contact area between the thermally-conductive particles in the first thermally-conductive dielectric layer 20 and the first light-filtering layer 30 may be 10%-50% of the total area of the first light-filtering layer 30.

The thicker the first thermally-conductive dielectric layer 20, the higher the thermal resistance value (a ratio between the thickness and the thermal conductivity) of the first thermally-conductive dielectric layer 20, and the poorer the thermal conductive (heat dissipation) effect of the first thermally-conductive dielectric layer 20. Those skilled in the art may set the thickness of the first thermally-conductive dielectric layer 20 according to teachings in the present disclosure. In one preferred embodiment, the thickness of the first thermally-conductive dielectric layer 20 may be less than 40 μm, and more preferentially less than 20 μm. The first thermally-conductive dielectric layer 20 with an above-described thickness may show better thermal conductive (heat dissipation) effect.

In one preferred embodiment, the first thermally-conductive dielectric layer 20 may be made of thermally-conductive dielectric composites containing thermally-conductive particles, or thermally-conductive dielectric composites containing thermally-conductive particles and glass powders. More preferentially, the first thermally-conductive dielectric layer 20 may be made of thermally-conductive particles treated by a silane coupling agent. A method that uses the silane coupling agent to treat the surface of the thermally-conductive particles may include using the silane coupling agent to carry out an immersion treatment of a thermally-conductive dielectric pre-layer formed by compressing the thermally-conductive dielectric composites containing the thermally-conductive particles. Thus, silane may be coupled with and attached to the surface of the thermally-conductive particles in the thermally-conductive dielectric pre-layer, thus forming the first thermally-conductive dielectric layer. Or, the silane coupling agent may be used to perform surface coating of the thermally-conductive particles, and the thermally-conductive particles covered by the silane coupling agent may be brush-coated to form the first thermally-conductive dielectric layer.

Silane coupling agents may be a type of special organic functional compound with one end of the molecular chain being an organophilic group and another end of the molecular chain being an inorganophilic group. Accordingly, by using the silane coupling agent to treat the thermally-conductive particles in the thermally-conductive dielectric preliminary layer, on one hand, an adhesive force between the thermally-conductive particles in the first thermally-conductive dielectric layer 20 may be enhanced, and on another hand, an adhesive force between the thermally-conductive particles in the first thermally-conductive dielectric layer 20 and the first light-filtering layer 30 may be enhanced. Accordingly, the thermal conductive (heat dissipation) effect of the first thermally-conductive dielectric layer 20 may be further improved. In one preferred embodiment, the volume fraction of the silane coupling agent on surface of the thermally-conductive particles in the first thermally-conductive dielectric layer 20 may be 0.1%-1%, and the silane coupling agent may preferentially be KH550, KH560, or KH570. The above-described silane coupling agent may not only have relatively good adhesive ability, but also have relatively good heat-resistant performance.

The type and fabrication process of the first thermally-conductive dielectric layer 20 may be related to the type of the wavelength conversion material layer 10. In one preferred embodiment, when the wavelength conversion material layer 10 is a silica gel-phosphor powder layer made of phosphor powders and silica gel, the first thermally-conductive dielectric layer 20 may be made of thermally-conductive dielectric composites containing thermally-conductive particles. When the wavelength conversion material layer 10 is a luminescent glass made of phosphor powders and glass powders, the first thermally-conductive dielectric layer 20 may be made of thermally-conductive dielectric composites containing thermally-conductive particles, or made of thermally-conductive dielectric composites containing thermally-conductive particles and glass powders. In particular, the silica gel-phosphor powder layer may be formed by solidification of the phosphor powders and the silica gel. The luminescent glass may be formed by sintering the phosphor powders and the glass powders. The thermally-conductive dielectric composites may be disposed on the wavelength conversion material layer 10 via processes such as spraying, brush painting, or silk-screen printing, etc. Specific parameters of the above-mentioned processes may be configured according to existing techniques, which are not repeatedly described here.

The wavelength conversion material layer 10 may be a silica gel-phosphor powder layer or a luminescent glass. The first thermally-conductive dielectric layer 20 may also be formed by compressing the thermally-conductive dielectric composites containing the thermally-conductive particles, and then using silane coupling agent to treat the surface of the thermally-conductive particles. In one preferred embodiment, the thermal conductivity of the thermally-conductive particles in the first thermally-conductive dielectric layer 20 may be greater than 10 W/mK. More preferentially, the thermally-conductive particles may be one or more materials selected from diamond, carbon nanotubes, graphene, aluminum nitride, silicon nitride, silicon carbide, boron nitride, aluminum oxide, zinc oxide, or barium sulfate. The thermally-conductive particles may be stacked and connected with one another to form a reticular structure, and the reticular structure may timely conduct out the heat generated by the wavelength conversion material layer 10.

The thermal conductive effect of the reticular structure may be related to the shape and dimension of the thermally-conductive particles. Preferentially, the thermally-conductive particles may be flake-like or fiber-like, and the flake-like or fiber-like thermally-conductive particles may be stacked and better connected with one another to form the reticular structure. More preferentially, the particle size of the thermally-conductive particles may be 0.1 μm-20 μm. Here, the particle size of the thermally-conductive particles may refer to the maximum length of the thermally-conductive particles in a three-dimensional space. For example, the particle size of the fiber-like thermally-conductive particles may refer to the length of the fiber-like thermally-conductive particles. The larger the particle size of the thermally-conductive particles, the easier the thermally-conductive particles to be stacked and form the reticular structure. It should be noted that, to reduce adsorption of the excited light by the thermally-conductive particles, the thermally-conductive particles may preferentially be white or transparent.

Figure 2B:
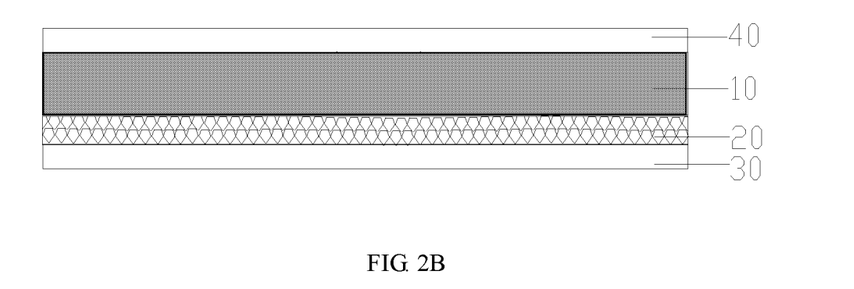
FIG. 2B illustrates a schematic view of an exemplary wavelength conversion device according to another preferred embodiment of the present disclosure.

The above-described wavelength conversion device may include other structures, and is not limited to include the wavelength conversion material layer 10, the first light-filtering layer 30, and the first thermally-conductive dielectric layer 20. In one preferred embodiment, the wavelength conversion device may also include a second light-filtering layer 40 disposed on a second side of the wavelength conversion material layer 10, and the structure of the wavelength conversion device is shown in FIG. 2B. In this case, the operation process of the wavelength conversion device may be implemented as follows. The excitation light emitted by the excitation light source may traverse the first light-filtering layer 30 to illuminate the wavelength conversion material layer 10 and excite the wavelength conversion material layer 10 to generate excited light. The excited light may illuminate the second light-filtering layer 40, small-angle excited light may traverse the second light-filtering layer 40, and large-angle excited light may be reflected back to the wavelength conversion material layer 10 by the second light-filtering layer 40. Then, the wavelength conversion material layer 10 may scatter and reflect the large-angle excited light back to the second light-filtering layer 40 by the diffuse reflection effect, and after several such processes, all the excited light may be emitted at small angles, thus improving the light utilization rate of the emergent light. Here, the second side may refer to the light-emitting side of the wavelength conversion material layer.

The first light-filtering layer 30 and the second light-filtering layer 40 may be common light-filtering films in the art. Optionally, the first light-filtering layer 30 and the second light-filtering layer 40 may be two-layer or more than two-layer dielectric films made of materials with different optical refractivity, for example, hollow optical thin films. Further, the first light-filtering layer 30 and the second light-filtering layer 40 may also be optical thin films containing regularly distributed photonic crystals, or combined films of the optical thin films and the dielectric films made of materials with different optical refractivity as described above.

Figure 2C:
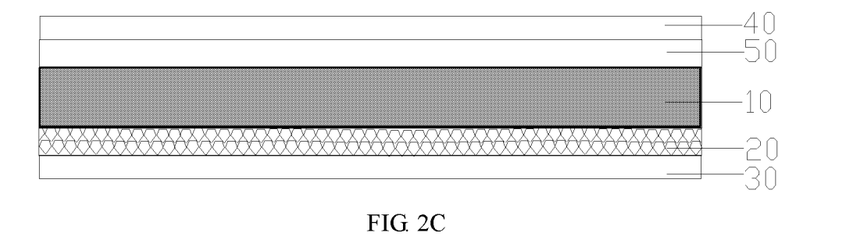
FIG. 2C illustrates a schematic view of an exemplary wavelength conversion device according to another preferred embodiment of the present disclosure.

In another preferred embodiment, the wavelength conversion device may also include a dielectric layer 50 (the structure illustrated in FIG. 2C) sandwiched between the wavelength conversion material layer 10 and the second light-filtering layer 40. The refractivity of the dielectric layer 50 may be less than the refractivity of the wavelength conversion material layer 10. The dielectric layer 50 may have relatively low refractivity, such that all reflection may be utilized to reflect the large-angle light from the wavelength conversion material layer 10 to the wavelength conversion material layer 10. Accordingly, excitation light unabsorbed by the wavelength conversion material layer 10 may be secondarily utilized, and large-angle excited light may be scattered to become small-angle light by the wavelength conversion material for emission, thus further improving the conversion efficiency of the excitation light and the light utilization rate. The dielectric layer 50 may be made of a dielectric material with a low refractivity. Optionally, the dielectric layer 50 may be an air dielectric layer sandwiched between the wavelength conversion material layer 10 and the second light-filtering layer 40.

Figure 2D:
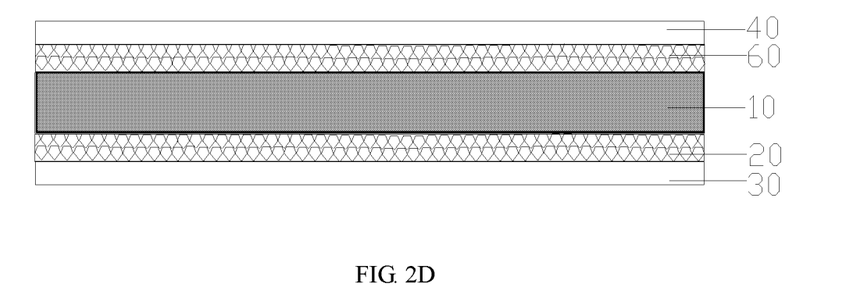
FIG. 2D illustrates a schematic view of an exemplary wavelength conversion device according to another preferred embodiment of the present disclosure.

In another preferred embodiment, the wavelength conversion device may also include a second thermally-conductive dielectric layer 60 (the structure illustrated in FIG. 2D) sandwiched between the wavelength conversion material layer 10 and the second light-filtering layer 40. The thermal conductivity of the second thermally-conductive dielectric layer 60 may be greater than or equal to the thermal conductivity of the wavelength conversion material layer 10, and the refractivity of the second thermally-conductive dielectric layer 60 may be less than the refractivity of the wavelength conversion material layer 10. The second thermally-conductive dielectric layer 60 may have the same properties as the disclosed first thermally-conductive dielectric layer 20. The heat generated by the wavelength conversion material layer 10 may be conducted towards the second side of the wavelength conversion material layer 10 via the second thermally-conductive dielectric layer 60. Accordingly, the heat generated by the wavelength conversion material layer 1010 may be more timely conducted out, thus further improving the brightness and stability of the excited light generated by the wavelength conversion device. Meanwhile, the refractivity of the second thermally-conductive dielectric layer 60 may be less than the thermal conductivity of the wavelength conversion material layer 10, such that large-angle light from the wavelength conversion material layer 10 may be reflected back to the wavelength conversion material layer 10. Accordingly, the excitation light unabsorbed by the wavelength conversion material layer 10 may be secondarily utilized, and the large-angle excited light may be scattered to be small-angle light via the wavelength conversion material for emission, thus further improving the conversion efficiency of the excitation light generated by the wavelength conversion device and the light utilization rate.

The present disclosure also provides a light source system including an excitation light source and a wavelength conversion device. In particular, the wavelength conversion device may be a wavelength conversion device described above in the present disclosure. The heat generated by the wavelength conversion material layer in the wavelength conversion device may be timely conducted out, thus improving the brightness and stability of the excited light generated by the wavelength conversion device. Accordingly, the brightness and stability of the light source system may be improved.

Further, the present disclosure also provides a projection system including a projection unit and a light source system. In particular, the light source system may be a light source system described above in the present disclosure. The light brightness and stability of the light source system in the projection system may be improved, thus satisfying the requirements of light brightness for the projection system in use.

Hereinafter, exemplary embodiments of the present disclosure will be made in more detail. However, these exemplary embodiments may be embodied in various different forms, and should not be construed as limited to the embodiments set forth herein. It should be understood that, these embodiments are provided so that this disclosure will be thorough and complete, and will fully convey the spirit of these exemplary embodiments to those skilled in the art.

Hereinafter, the disclosed wavelength conversion device will be further illustrated with reference to specific embodiments.

Embodiment 1

The wavelength conversion device may include a wavelength conversion material layer, a first light-filtering layer disposed on a first side of the wavelength conversion material layer, a first thermally-conductive dielectric layer sandwiched between the wavelength conversion material layer and the first light-filtering layer, a second light-filtering layer disposed on a second side of the wavelength conversion material layer, and a second thermally-conductive dielectric layer sandwiched between the wavelength conversion material layer and the second light-filtering layer. In particular, the wavelength conversion material layer may be a luminescent glass formed by sintering phosphor powders and glass powders, the thermal conductivity of the wavelength conversion material layer may be 5.0 W/mK, and the refractivity of the wavelength conversion material layer may be 2.2. The first thermally-conductive dielectric layer may be formed by silk-screen printing and pressing diamond particles (average particle size of 5 μm) on surface of the first side of the wavelength conversion material, and then using silane coupling agent (KH560) to treat the surface of the diamond particles. The second thermally-conductive dielectric layer may be formed by silk-screen printing and pressing diamond particles (average particle size of 5 μm) on surface of the second side of the wavelength conversion material, and then using silane coupling agent (KH560) to treat the surface of the diamond particles.

The first thermally-conductive dielectric layer may have the following features. The contact area between the diamond particles in the first thermally-conductive dielectric layer and the first light-filtering layer may account for 30% of the total area of the first light-filtering layer. The thickness of the first thermally-conductive dielectric layer may be 3 μm. The thermal conductivity of the first thermally-conductive dielectric layer may be 12.8 W/mK, and the refractivity of the first thermally-conductive dielectric layer may be 1.4. The volume fraction of the silane coupling agent (KH560) on the surface of the diamond particle in the first thermally-conductive dielectric layer may be 1%.

The second thermally-conductive dielectric layer may have the following features. The contact area between the diamond particles in the second thermally-conductive dielectric layer and the second light-filtering layer may account for 30% of the total area of the second light-filtering layer. The thickness of the first thermally-conductive dielectric layer may be 3 μm. The thermal conductivity of the thermal thermally-conductive dielectric layer may be 12.8 W/mK, and the refractivity of the second thermally-conductive dielectric layer may be 1.4. The volume fraction of the silane coupling agent (KH560) on the surface of the diamond particle in the second thermally-conductive dielectric layer may be 1%.

Embodiment 2

The wavelength conversion device may include a wavelength conversion material layer, a first light-filtering layer disposed on a first side of the wavelength conversion material layer, a first thermally-conductive dielectric layer sandwiched between the wavelength conversion material layer and the first light-filtering layer, a second light-filtering layer disposed on a second side of the wavelength conversion material layer, and a dielectric layer sandwiched between the wavelength conversion material layer and the second light-filtering layer. In particular, the wavelength conversion material layer may be a silica gel-phosphor powder layer formed by solidification of phosphor powders and silica gel. The first thermally-conductive dielectric layer may be formed by brush-coating and pressing fiber-like carbon nanotubes (average particle size of 20 μm) on the wavelength conversion material layer, and then using the silane coupling agent (KH560) to treat the surface of the carbon nanotubes. The thermal conductivity of the wavelength conversion material layer may be 5.0 W/mK, the refractivity of the wavelength conversion material layer may be 2.2, and the dielectric layer may be an air dielectric layer.

The first thermally-conductive dielectric layer may have the following features. The contact area between the carbon nanotubes in the first thermally-conductive dielectric layer and the first light-filtering layer may account for 20% of the total area of the first light-filtering layer. The thickness of the first thermally-conductive dielectric layer may be 6 μm. The thermal conductivity of the first thermally-conductive dielectric layer may be 12.5 W/mK, and the refractivity of the first thermally-conductive dielectric layer may be 1.5. The volume fraction of the silane coupling agent (KH560) on the surface of the carbon nanotubes in the first thermally-conductive dielectric layer may be 1%.

Embodiment 3

The wavelength conversion device may include a wavelength conversion material layer, a first light-filtering layer disposed on a first side of the wavelength conversion material layer, a first thermally-conductive dielectric layer sandwiched between the wavelength conversion material layer and the first light-filtering layer, and a second light-filtering layer disposed on a second side of the wavelength conversion material layer. In particular, the wavelength conversion material layer may be a silica gel-phosphor powder layer formed by solidification of phosphor powders and silica gel. The thermal conductivity of the wavelength conversion material layer may be 5.0 W/mK, and the refractivity of the wavelength conversion material layer may be 2.2. The first thermally-conductive dielectric layer may be formed by spraying and pressing diamond particles (average particle size of 2 μm) onto the wavelength conversion material.

The first thermally-conductive dielectric layer may have the following features. The contact area between the diamond particles in the first thermally-conductive dielectric layer and the first light-filtering layer may account for 10% of the total area of the first light-filtering layer. The thickness of the first thermally-conductive dielectric layer may be 20 μm. The thermal conductivity of the first thermally-conductive dielectric layer may be 12.4 W/mK, and the refractivity of the first thermally-conductive dielectric layer may be 1.6.

Embodiment 4

The wavelength conversion device may include a wavelength conversion material layer, a first light-filtering layer disposed on a first side of the wavelength conversion material layer, and a first thermally-conductive dielectric layer sandwiched between the wavelength conversion material layer and the first light-filtering layer. In particular, the wavelength conversion material layer may be a luminescent glass formed by solidification of phosphor powders and glass powders. The thermal conductivity of the wavelength conversion material layer may be 5.2 W/mK, and the refractivity of the wavelength conversion material layer may be 2.3. The first thermally-conductive dielectric layer may be formed by silk-screen printing and sintering the diamond particles (average particle size of 2 μm) and the glass powders on the wavelength conversion material.

The first thermally-conductive dielectric layer may have the following features. The contact area between the diamond particles in the first thermally-conductive dielectric layer and the first light-filtering layer may account for 50% of the total area of the first light-filtering layer. The thickness of the first thermally-conductive dielectric layer may be 15 μm. The thermal conductivity of the first thermally-conductive dielectric layer may be 13 W/mK, and the refractivity of the first thermally-conductive dielectric layer may be 1.3.

Embodiment 5

The wavelength conversion device may include a wavelength conversion material layer, a first light-filtering layer disposed on a first side of the wavelength conversion material layer, and a first thermally-conductive dielectric layer sandwiched between the wavelength conversion material layer and the first light-filtering layer. In particular, the wavelength conversion material layer may be a silica gel-phosphor powder layer formed by solidification of phosphor powders and silica gel. The thermal conductivity of the wavelength conversion material layer may be 4.8 W/mK, and the refractivity of the wavelength conversion material layer may be 2.2. The first thermally-conductive dielectric layer may be formed by spraying and pressing flake-like silicon nitride particles (average particle size of 0.1 μm) on the wavelength conversion material.

The first thermally-conductive dielectric layer may have the following features. The contact area between the silicon nitride particles in the first thermally-conductive dielectric layer and the first light-filtering layer may account for 8% of the total area of the first light-filtering layer. The thickness of the first thermally-conductive dielectric layer may be 40 μm. The thermal conductivity of the first thermally-conductive dielectric layer may be 12 W/mK, and the refractivity of the first thermally-conductive dielectric layer may be 1.6.

Contrastive Example 1

The wavelength conversion device may include a wavelength conversion material layer, a dielectric layer and a first light-filtering layer disposed sequentially on a first side of the wavelength conversion material layer, and a dielectric layer and a first light-filtering layer disposed sequentially on another side of the wavelength conversion material. In particular, the wavelength conversion material layer may be a silica gel-phosphor powder layer formed by solidification of phosphor powders and silica gel, and the dielectric layer may be an air dielectric layer.

Figure 3:
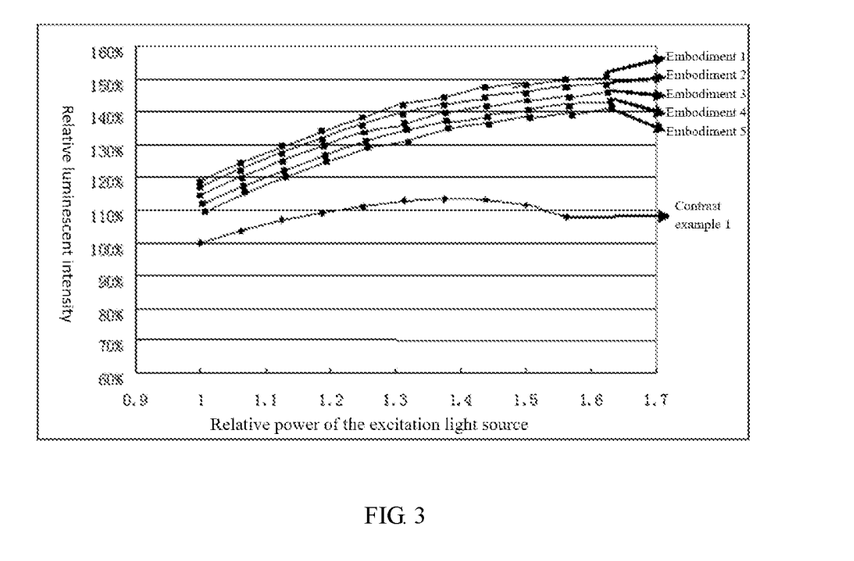
FIG. 3 illustrates a relationship between luminescent intensity of a wavelength conversion device and power of an excitation light according to Embodiment 1 and a Contrastive example 1.

Test: for the wavelength conversion devices provided by Embodiment 1 to 5 and Contrast example 1, the relationship of the luminescent intensity of the wavelength conversion device versus the power of the excitation light are measured, respectively, and the measurement results are illustrated in FIG. 3.

From FIG. 3, it can be seen that for the wavelength conversion devices provided by Embodiment 1 to 5 and Contrast example 1, the luminescent intensity of the wavelength conversion devices may increase as the power of the excitation light source increases. When the powers of the excitation light source are the same, the luminescent intensity of the wavelength conversion devices provided by Embodiment 1 to 5 may be far higher than the luminescent intensity of the wavelength conversion device provided by the Contrast example 1. Meanwhile, as the power of the excitation light source increases, the luminescent intensity of the wavelength conversion device provided by Embodiment 1 to 5 may increase approximately linearly, and the luminescent intensity of the wavelength conversion device provided by Contrast example 1 may first increase, and later decrease. From the above analysis, it can be concluded that, the thermally-conductive dielectric layer in the wavelength conversion devices provided by Embodiment 1 to 5 may timely conduct out the heat generated by the wavelength conversion material layer, thus improving the brightness and stability of the excited light generated by the wavelength conversion device. Accordingly, the conversion efficiency of the wavelength conversion device may be improved.

From the foregoing descriptions, it can be seen that the disclosed embodiments may realize the following technical effects.

(1) A thermally-conductive dielectric layer may be sandwiched between a wavelength conversion material layer and a first light-filtering layer. The thermal conductivity of the thermally-conductive dielectric layer may be greater than or equal to the thermal conductivity of the wavelength conversion material layer, thus the heat generated by the wavelength conversion material layer may be timely conducted out. Accordingly, the brightness and the stability of the excited light generated by the wavelength conversion device may be improved.

(2) Meanwhile, the refractivity of the thermally-conductive dielectric layer may be less than the refractivity of the wavelength conversion material layer, thus the thermally-conductive dielectric layer may reflect large-angle light (including excitation light) from the wavelength conversion material layer back to the wavelength conversion material layer. Accordingly, excitation light unabsorbed by the wavelength conversion material layer may be secondarily utilized to improve the conversion efficiency of the wavelength conversion device.

The above descriptions are merely preferred embodiments of the present disclosure, and are not intended to limit the present disclosure. For those skilled in the art, the present disclosure may have various modifications and alterations. Without departing from the spirit and scope of the present disclosure, any modifications, equivalent replacements, and improvements, etc., shall all fall within the protection scope of the present disclosure.

What is claimed is:

1. A wavelength conversion device, comprising:
   a wavelength conversion material layer, and a first light-filtering layer disposed on a first side of the wavelength conversion material layer, the wavelength conversion device further comprising: a first thermally-conductive dielectric layer configured between the wavelength conversion material layer and the first light-filtering layer,
   wherein the first thermally-conductive dielectric layer has a thermal conductivity greater than or equal to the wavelength conversion material layer, and has a refractivity less than the wavelength conversion material layer, and
   the first thermally-conductive dielectric layer is a porous structural layer containing thermally-conductive particles.

2. The wavelength conversion device according to claim 1, wherein:
   the first thermally-conductive dielectric layer covers a surface of the first light-filtering layer, and
   a contact area between the thermally-conductive particles and the first light-filtering layer is 10%-50% of a total area of the first light-filtering layer.

3. The wavelength conversion device according to claim 1, wherein:
   a thickness of the first thermally-conductive dielectric layer is less than 40 μm, or less than 20 μm.

4. The wavelength conversion device according to claim 1, wherein:
   the first thermally-conductive dielectric layer is made of thermally-conductive dielectric composites containing the thermally-conductive particles and glass powders.

5. The wavelength conversion device according to claim 1, wherein:
   the first thermally-conductive dielectric layer is made of the thermally-conductive particles treated by a silane coupling agent.

6. The wavelength conversion device according to claim 5, wherein:
   a volume fraction of the silane coupling agent on surface of the thermally-conductive particles in the first thermally-conductive dielectric layer is 0.1%-1%, and the silane coupling agent includes KH550, KH560, or KH570.

7. The wavelength conversion device according to claim 1, wherein:
   the wavelength conversion material layer is a silica gel-phosphor powder layer made of phosphor powders and silica gel.

8. The wavelength conversion device according to claim 1, wherein:
   the wavelength conversion material layer is a luminescent glass comprising phosphor powders and glass powders.

9. The wavelength conversion device according to claim 1, wherein:
   a thermal conductivity of the thermally-conductive particles is higher than 10 W/mK.

10. The wavelength conversion device according to claim 9, wherein:
    the thermally-conductive particles are one or more materials selected from diamond, carbon nanotubes, graphene, aluminum nitride, silicon nitride, silicon carbide, boron nitride, aluminum oxide, zinc oxide, and barium sulfate.

11. The wavelength conversion device according to claim 9, wherein:

the thermally-conductive particles are flake-shaped or fiber-shaped, and the thermally-conductive particles are white or transparent.

12. The wavelength conversion device according to claim 9, wherein:

a particle size of the thermally-conductive particles is 0.1 μm-20 μm.

13. The wavelength conversion device according to claim 1, further comprising:

a second light-filtering layer disposed on a second side of the wavelength conversion material layer.

14. The wavelength conversion device according to claim 13, further comprising:

a dielectric layer configured between the wavelength conversion material layer and the second light-filtering layer, wherein the dielectric layer has a refractivity less than the wavelength conversion material layer.

15. The wavelength conversion device according to claim 13, further comprising:

a second thermally-conductive dielectric layer configured between the wavelength conversion material layer and the second light-filtering layer, wherein the second thermally-conductive dielectric layer has a thermal conductivity greater than or equal to the wavelength conversion material layer, and has a refractivity less than the wavelength conversion material layer.

16. The wavelength conversion device according to claim 15, wherein:

the second thermally-conductive dielectric layer has a same feature as the first thermally-conductive dielectric layer.

17. A light source system including a wavelength conversion device according to claim 1, further comprising:

an excitation light source providing a light source for the wavelength conversion device.

18. A projection system including the light source system according to claim 17, comprising:

a projection unit, and a light source system.

\* \* \* \* \*